United States Patent [19]

Furno et al.

[11] Patent Number: 4,816,813
[45] Date of Patent: Mar. 28, 1989

[54] RASTER SCAN EMULATION OF CONVENTIONAL ANALOG CRT DISPLAYS

[75] Inventors: Gregory S. Furno, Madison; Steven Kellner, Middleton, both of Wis.

[73] Assignee: Nicolet Instrument Corporation, Madison, Wis.

[21] Appl. No.: 211,120

[22] Filed: Jun. 21, 1988

Related U.S. Application Data

[63] Continuation of Ser. No. 909,824, Sep. 19, 1986, abandoned.

[51] Int. Cl.$^4$ .............................................. G09G 1/00
[52] U.S. Cl. ................................... 340/724; 340/799; 340/747
[58] Field of Search ............... 340/722, 747, 792, 726, 340/734, 794, 798, 724, 723; 364/518, 521

[56] References Cited

U.S. PATENT DOCUMENTS

| | | | |
|---|---|---|---|
| 3,786,476 | 1/1974 | Graves et al. | 340/799 |
| 3,818,476 | 6/1974 | Kunner et al. | 340/734 |
| 4,228,432 | 10/1980 | Osborne | 340/736 |
| 4,400,730 | 8/1983 | Nagao et al. | 340/734 |
| 4,415,889 | 11/1983 | Davis | 340/728 |
| 4,470,043 | 9/1984 | Sorense et al. | 340/722 |
| 4,471,349 | 9/1984 | Strolle | 340/727 |
| 4,474,501 | 10/1984 | LaRussa | 434/43 |
| 4,475,104 | 10/1984 | Shen | 340/729 |
| 4,481,594 | 11/1984 | Staggs et al. | 340/701 |
| 4,482,893 | 11/1984 | Edelson | 340/723 |
| 4,486,746 | 12/1984 | Walker | 340/750 |
| 4,490,797 | 12/1984 | Staggs et al. | 340/721 |
| 4,491,832 | 1/1985 | Tanaka | 340/721 |
| 4,492,956 | 1/1985 | Collmeyer et al. | 340/723 |
| 4,529,978 | 7/1985 | Rupp | 340/727 |

Primary Examiner—John W. Caldwell, Sr.
Assistant Examiner—Alvin Oberley
Attorney, Agent, or Firm—Lathrop & Clark

[57] ABSTRACT

A segment constituting several points of digitized waveform data from a digitizer is stored in a pixel memory which has a number of memory locations corresponding to the number of pixels in the horizontal screen width of a raster scan video screen. As each new data point is written into a sequentially higher location in the memory, the data at the memory location a selected number of memory locations lower, constituting the desired number of pixels in the waveform segment, is erased. When a full new segment of data is in the waveform memory, the contents of the memory is provided to a raster scan graphics control unit which causes a new raster scan frame to be written on the video monitor screen. Only the portion of the waveform corresponding to the segment of waveform data in the waveform memory is illuminated on the screen. New data continues to be written into the waveform memory until another full segment of waveform data is in the memory and all previous waveform data points have been erased. The content of the waveform memory then is again provided to the raster scan graphics control which causes another raster scanned frame to appear on the video monitor screen, with the new segment of waveform illuminated on the video screen displaced sequentially from the previously displayed waveform segment. The continued illumination of new waveform segments in this manner causes the waveform to appear to move from left to right across the video screen in a fashion which emulates a conventional analog CRT display of the waveform.

19 Claims, 3 Drawing Sheets

RASTER SCAN EMULATION OF CONVENTIONAL ANALOG CRT DISPLAYS

This application is a continuation of application Ser. No. 909,824, filed 19, 1985, abandoned.

FIELD OF THE INVENTION

This invention pertains generally to the field of video display systems and particularly to the display of signal waveforms.

BACKGROUND OF THE INVENTION

In a conventional cathode ray tube (CRT) display such as used in oscilloscopes, a time varying electrical signal can be displayed on the CRT screen by sweeping the electron beam horizontally across the screen repetitively at a selected sweep rate while deflecting the beam vertically proportional to the magnitude of the electrical signal being monitored. If the sweep rate is properly timed with respect to the frequency of the signal, a relatively stable waveform will appear on the screen which can be examined by the operator. The conventional CRT analog oscilloscope can also be used to display signals which vary relatively slowly, using a relatively slow sweep of the electron beam across the face of the CRT. For such slowly varying signals, an entire waveform does not appear on the CRT screen but rather a moving "tail" or streak of light which corresponds to the leading portion of the waveform as the electron beam moves across the screen. Such relatively slow time varying waveforms are commonly encountered in medical monitoring equipment.

In modern, complex and computerized medical equipment, the CRT display often is the primary means of communicating information to the operator. Such equipment is also often utilized to perform substantial analysis on the input data signals and to display the results of such analyses to the operator along with the raw signal waveform information. Many such machines use a raster scanned CRT display in which the entire screen is scanned several times a second, allowing the simultaneous display of graphics, alphanumerics and waveforms. In raster scanned displays, the waveform does not change continuously as in analog oscilloscopes, but is refreshed at the raster scan frame rate, typically 60 frames a second.

One type of medical equipment in which raster scanned CRT displays have been used is electromyography (EMG) monitoring machines, in which a visual display is provided, in addition to an audio output signal, to allow examination of the electrical activity from a needle electrode inserted into the muscles of a subject under study. Skilled operators are adept at interpreting the simultaneous visual and auditory signals from electrical activity generated, either voluntarily or spontaneously, by the subject's muscles. The operator's movement of the needle electrode through the muscles also generates EMG activity. Prior to the introduction of raster scanned display EMG instruments, visual EMG records were produced using conventional analog oscilloscopes. Such conventional oscilloscopes are well suited to viewing real time, free running visual records such as those generated by EMG activity. Operators have attempted to use the newer digital raster scanned EMG instruments to produce real time, free running visual records of EMG activity as they had done previously with conventional analog oscilloscopes. However, the raster scan display of a waveform differs in significant respects from the conventional analog display. In particular, raster scan CRT screens ordinarily have a high resolution phosphor on the inside screen face which is characterized by low persistence, rather than the relatively high persistence phosphor used in conventional analog oscilloscope CRTs. The low persistence of the raster scan display screen insures that there is no interference in illumination between frames in the scan. However, because of the manner in which the real time waveforms appear on the raster scan display, EMG operators have noticed an illusion of a delay between the visual presentation of the waveform on the screen and the audio signal corresponding to the EMG activity, making it more difficult for the operators to correlate the audio and visual signals as they normally would.

Present raster scan display EMG monitors typically show a free running signal as a waveform which extends across the entire screen. Each time a new frame is displayed, the new data points acquired since the last frame are added to the leading edge of the waveform as new illuminated picture elements (pixels) and the pixels occupying the horizontal positions corresponding to the new data points are erased (non-illuminated). The pixels corresponding to the rest of the waveform remain illuminated and unchanged until the leading edge of the waveform passes them. A typical screen sweep width is approximately 100 milliseconds, and thus each of the illuminated points in a single sweep of the waveform will remain illuminated for a full 100 milliseconds. However, the period of visual latency is generally only about 40 milliseconds, and the time delay between the initial appearance of the waveform on the screen and its erasure may disrupt the operator's ability to coordinate the visual and auditory information, particularly during electrode insertion, since operators can perceive both the illumination of new data points and the erasure of old data points. The operators may thus find it difficult to properly coordinate the visual and audio signals.

SUMMARY OF THE INVENTION

In accordance with the present invention, waveforms are presented on a raster scanned CRT screen in a manner which emulates the appearance of free running waveforms on a conventional analog CRT screen. This is preferably accomplished by separating the digitized waveform constituting a full screen width of waveform data into several segments of the data. These segments are then presented sequentially onto the screen with each frame in the raster scan so that the waveform appears to the operator to move across the screen from left to right in rapid steps, simulating a continuously changing analog CRT waveform having a short tail due to the persistence of the phosphor. Thus, when the input signal is of sufficient magnitude to provide an audible output signal from an audio monitor in, for example, an EMG machine, the portion of the signal responsible for the audio output will be shown on the CRT screen at substantially the same time that the sound is heard by the operator, and only that portion of the waveform corresponding to the source of the audio signal will be shown at that time. In this manner, skilled operators can correlate the visual waveform data with the audio signal in a manner entirely consistent with the coordination of such visual and aural signals using conventional analog oscilloscopes.

An apparatus incorporating the present invention, the input signal, such as a EMG signal from a needle probe, is converted from an analog signal to digital data in a waveform digitizer. Under the control of the system computer, the waveform data from the digitizer are provided to a waveform pixel memory of a raster scan display which, in one form, has memory cells corresponding in number to the number of pixels across a dimension, e.g., horizontally, of the CRT display screen or, in a second form, in a two dimensional array corresponding to the pixel array to be displayed on the CRT. The writing of data into the pixel memory from the digitizer is controlled such that for each new data point written into the pixel memory at a sequential location, the memory location a selected number of memory cells behind the location of new data point is erased, i.e., written with a color baseline datum which may correspond to the background color. Thus, at any point in time, the pixel memory includes a set of cells containing the new waveform magnitude information from the digitizer with all of the remaining cells in the pixel memory containing a baseline datum. As each raster frame is scanned onto the face of the CRT, the control computer causes the pixel memory to be written into the raster scan graphics controller. The raster scan controller then proceeds to generate a full frame of pixel data, e.g., by performing vector draw on the data from the pixel memory, and displays the frame onto the face of the CRT video monitor one line at a time, with this frame containing the new waveform data just obtained from the pixel memory. Under the control of the computer, data from the waveform digitizer is continuously read into the pixel memory in the manner described above, with the addition of each new data point being accompanied by the erasure of a data point at a memory location a selected number of memory location cells behind the new data point. When the display of any frame has been completed, the pixel memory now contains a new segment of waveform data with all of the remaining cells in the memory, including the cells previously containing the waveform for the last frame, containing a baseline datum. The waveform pixel memory is now read by the raster scan graphics control which then writes another frame onto the video monitor, and the process described is continuously repeated. To a human observer, the waveform shown on the video monitor appears to progress sequentially across the video screen in a manner similar to conventional analog CRT displays wherein a small tail of waveform data behind the moving beam remains on the screen transiently due to phosphor persistence. The moving waveform provided by the present invention, displayed essentially in real time, can be readily correlated by the observer with an audio output signal obtained by routing the EMG signal through an audio amplifier and speaker.

Further objects, features and advantages of the invention will be apparent from the following detailed description when taken in conjunction with the accompanying drawings.

DESCRIPTION OF THE PREFERRED EMBODIMENT

Figure 1:
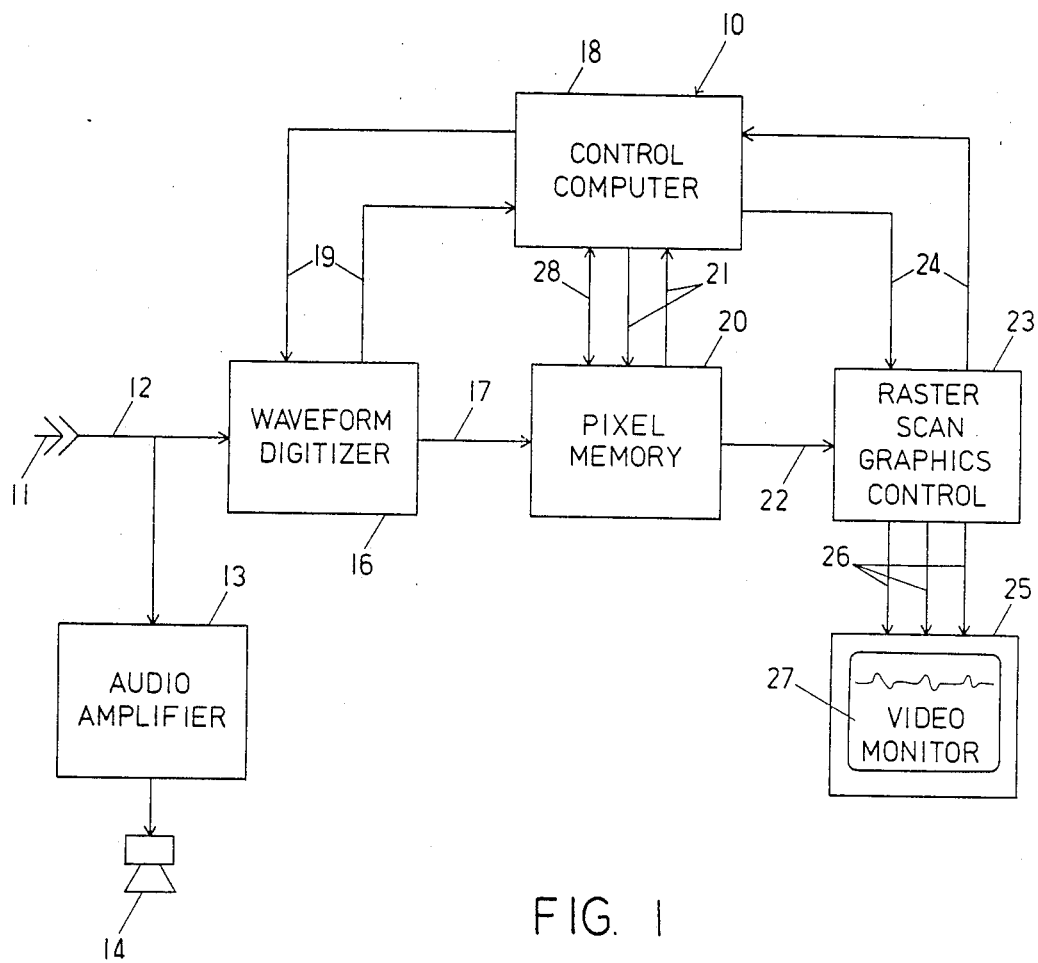
FIG. 1 is a block diagram of apparatus for providing waveform data on a video monitor in accordance with the present invention.

With reference to the drawings, a schematic block diagram of a video display apparatus which incorporates the raster scan emulation of the present invention is shown generally in 10 in FIG. 1. The apparatus 10 may be incorporated, for example, in an electromyography (EMG) monitoring apparatus, although it is understood that the present invention is not so limited and may be incorporated in other systems which monitor time varying signals and provide displays of such signals on raster scanned video monitors. The apparatus 10 receives a time varying analog electrical signal on a line 11 from a source of such signals, such as an EMG needle and amplifier, and is connected to an input line 12 which may provide the signal directly to an audio amplifier 13 and loud speaker 14, as is conventionally done with EMG signals. In addition, the analog time varying signal on the line 12 is provided to a waveform digitizer 16, which may be any suitable analog to digital converter well known in the art, which provides digital output data on an output line 17. The waveform digitizer 16 is under the control of a system control computer 18, through control lines 19, which monitors the waveform digitizer 16 to coordinate the generation of digital output data on the line 17 with other functions being performed by the system. The digital output on the line 17, which may be a parallel bus or a serial output line, as desired, is provided to a waveform pixel memory 20 which is also under the control of the system computer 18 by means of control lines 21. It is understood that in a typical EMG apparatus, the output data from the waveform digitizer may also be utilized to perform analyses and may be stored, for example, in long term fixed memory such as magnetic tape or magnetic disc media. The waveform pixel memory 20 is preferably a random access memory capable of storing the data provided on the line 17 under the control of the computer 18 to selected locations in the memory, with each of the pixel memory locations or cells being capable of storing sufficient bits of data to accommodate the output words from the waveform digitizer, the pixel color or other pixel attribute information. The output words from the waveform digitizer on the line 17 may be read, modified, and re-written by the control computer 18 to the pixel memory over a communication line, line 28, which may be a parallel bus or serial line, as desired. The waveform pixel memory may be arranged in alternate but equivalent forms. Where a raster scan controller 23 is used which performs vector draws between input data points, the waveform pixel memory 20 has a number of cells at least as great as the number of pixels to be displayed on one dimension, typically 512. The cells then contain either the baseline datum or words indicative of the magnitude of the waveform segment at the sampled points, and this data is used by the raster scan controller to perform vector draw calculations so that the waveform is displayed in two dimensions on the CRT. Alternatively, the number of memory locations or cells within the pixel memory 20 may be at least equal to the total number of picture elements (pixels) to be displayed, typically 512 by 512, with the computer 18 using the data from the digitizer to write the cells in the pixel memory with either the background color or the foreground pixel color at the pixel positions in memory corresponding to the points of the waveform which are to be illuminated on the CRT screen. For either type of pixel memory, the memory contains only a segment of a full frame of the waveform data at any one time.

Under the control of the computer 18 through control lines 21, the output of the pixel memory 20 is selectively provided on an output line 22, either as serial or parallel data, to a raster scan graphics controller 23, of appropriate design for the pixel memory used, which is controlled again by the computer 18 by signals on control lines 24. Where a vector draw controller 23 is used, the output data provided from the memory 20 to the raster scan controller would include the sequential address data of the memory location being read out, corresponding to the horizontal position on the screen of the data point, and the data at the memory address corresponding to the sampled magnitude of the input signal which will be used by the controller 23 to determine the vertical position and color and intensity of each data point on the video screen. The video signals which control the horizontal deflection, vertical deflection and intensity on the video monitor 25 are provided to it from the raster scan graphics control unit 23 on lines 26. It is preferred that the raster scan graphics control unit 23 be of the type which controls operation of the video monitor screen 27 to draw a point at a horizontal and vertical position, as determined by the vertical and horizontal position data from the pixel memory, with vertical pixel filling between adjacent horizontal points. The control computer 18 preferably controls the writing of data from the digitizer 16 such that each new digital data point from the digitizer is written into the pixel memory cells at a horizontally sequentially higher memory address, with wrap-around after exceeding the highest address in the memory back to the initial memory address in a circular fashion. It is understood that this function may be performed by the control computer 18 over data line 28 and control line 21.

Figure 2:
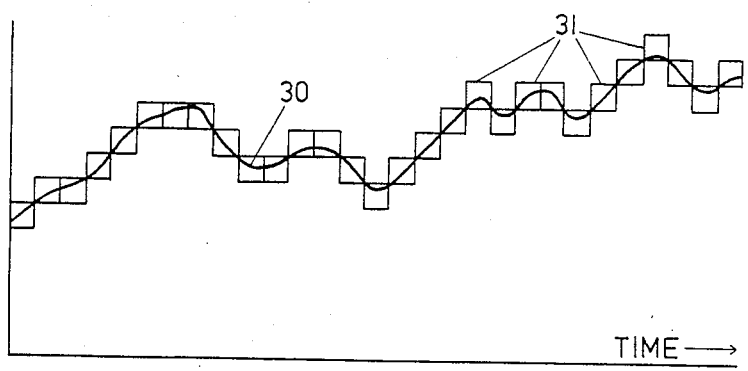
FIG. 2 is an illustrative graph showing a continuously varying waveform and the manner in which such a waveform may be presented on a raster scanned screen with separate pixels.
Figure 3:
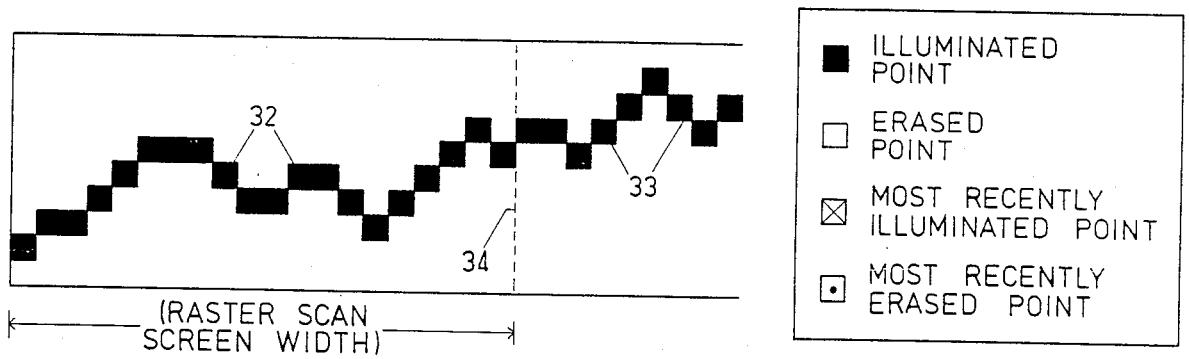
FIG. 3 is an illustrative graph showing the raster scan pixels of the waveform of FIG. 2 illustrating the waveform that .would be shown on the screen.

To illustrate the functioning of the invention, an example of the a time varying analog signal 30 is shown in FIG. 2 along with a digitized representation of the signal as it might be built up on a raster scan screen as shown by the pattern of square pixels 31. The representation composed of the pixels 31 in FIG. 2 is for illustrative purposes only, as it should be understood that the picture elements 31 would be substantially smaller to provide greater resolution in duplicating the continuous waveform 30. The width of each of the pixels 31 is determined by the number of pixels that are to be displayed on the raster scan screen horizontally, e.g., 512, 1024, etc., and the vertical height of each pixel on the screen is determined in accordance with the magnitude of the waveform 30 as sampled by the waveform digitizer 16 and stored in the pixel memory 20. As illustrated in FIG. 3, a time varying signal of interest will normally continue over a much longer time interval than that in which the signal can be displayed in one sweep of the signal across the screen width. The portion 32 of the pixelized waveform which can be displayed in one sweep is shown on the screen to the left of the right screen edge 34 in FIG. 3 and the later portion 33 of the waveform is shown, for illustration only, to the right of the screen edge 34.

Figure 4A:
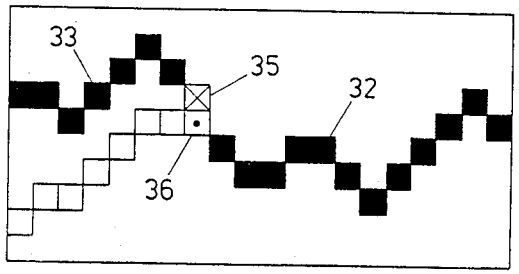
FIGS. 4A and 4B are representations of the prior art presentation of a waveform built of a pixels on a raster scanned screen.
Figure 4B:
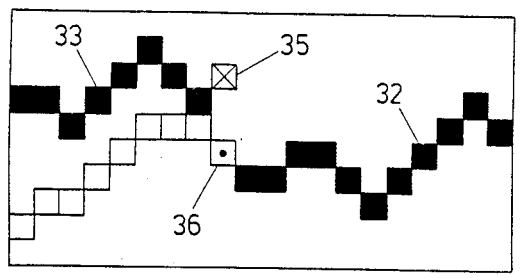

FIGS. 4A and 4B illustrate the manner in which prior raster scanned systems displayed the time varying waveform as it progressed across the screen and overwrote the previously existing portion of the waveform that was still displayed from the previously sweep across the screen. Assuming that one pixel of new waveform data will be shown on the screen for each new frame in the raster screen (ordinarily, several pixels would be changed each time a new frame is shown), as each new waveform point is acquired from the waveform digitizer, the point is displayed on the screen by illuminating a pixel 35 to the right of and adjacent to the current rightmost illuminated waveform point. At the same time, the pre-existing illuminated waveform pixel 36 directly above or below the new pixel 35 is erased from the screen. The sweep progresses in this manner to the right across the screen until it reaches the last rightmost position on the screen, whereupon it begins again from the leftmost pixel on the screen and again propagates from left to right across the screen. Thus, each illuminated pixel will remain illuminated until the sweep again passes it. For a typical raster scan monitor for an EMG machine, as an example, the sweep time, and thus illumination time for each pixel, will be approximately 100 milliseconds. However, the period of visual latency is only about 40 milliseconds, and the time delay of presentation of the waveform on the screen is perceptible and can contribute to operator confusion in interpreting the waveform, particularly causing difficulty in coordinating the audio output from the loudspeaker 14, corresponding to an audible event in the detected signal, and the visual presentation of that event on the video monitor 25.

Figure 5A:
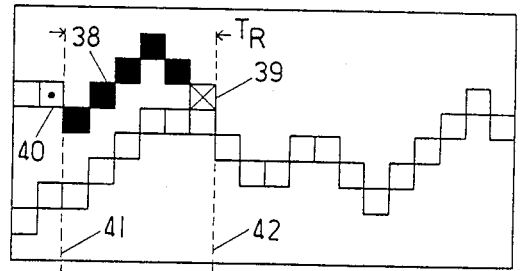
FIG. 5A and 5B are illustrative graphs showing the manner in which the waveform pixel memory, containing an entire screen of data, would be sequentially written and erased with new data points in accordance with the present invention.
Figure 5B:
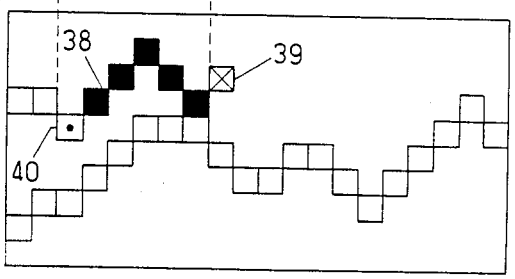

In the raster scanned display system of the present invention, only a segment of the previously acquired waveform is displayed on the screen at any point in time, i.e., during any frame. Rather than the pixel or pixels at the same horizontal location of the new pixel or pixels being erased, as in the prior art systems, for each new frame a pixel or pixels corresponding to data acquired at a specific earlier time is erased. By displaying on the video screen an appropriate number of illuminated data points and erasing all others, it is possible to provide a waveform display of a duration which is long enough to give a visible waveform, yet short enough to provide an imperceptible delay between illumination and erasure of the waveform. This is illustrated in the views of FIGS. 5A and 5B, in which a waveform segment 38 composed of a plurality of pixels is displayed on the screen while other portions of the previously acquired waveform are not shown. If only a single pixel were changed each time a new frame is displayed, the new pixel 39 would be illuminated while simultaneously an old pixel 40, corresponding to a data point in the waveform a period of time $T_R$ earlier, is erased. The time period $T_R$ corresponds to the horizontal distance between the positions 41 and 42 on the screen. As illustrated in FIG. 5B, the illumination of etch new data point 39 in the waveform would result of in the erasure of only-a single data point 40, and the waveform segment 38 would progress across the screen in a manner essentially identical to what is observed in an ordinary analog oscilloscope which displays tail of waveform following the leading edge of the waveform due to phosphor persistence.

In conventional video monitor systems, many horizontal data points are provided to increase resolution, typically at least 512. Since the sweep time of the waveform across the screen will generally be much faster than that which would allow only one pixel to be changed with each new frame, an emulation pattern as shown in FIG. 5A and 5B, in which one pixel is changed at a time, cannot be used. However, in accordance with the present invention it has been discovered that by changing sequential multiple pixel segments of the waveform progressively across the screen with each new frame, an emulation of a sweep is provided to the operator which appears to him to be very similar to the sweep of a waveform as observed on an analog oscilloscope. Given the common human visual latency period of approximately 40 milliseconds, and a refresh rate $f_R$ of the raster scan display screen, to provide a suitable appearance to the observer of a moving waveform it is preferred that the duration of illumination $T_R$ of any particular pixel on the screen be at least the inverse of the raster scan refresh rate f and no greater than the visual latency of approximately 40 milliseconds. For a typical raster scan rate of 60 frames per second, the minimum preferred duration is 16.6 milliseconds. The number of pixels $N_R$ illuminated in the waveform at any point in time or for any frame may then be given by the expression $N_R=N(T_R/T_{swp})$ where N is the number of pixels in the horizontal screen width and $T_{swp}$ the time width of the screen. For example, a typical screen will have a screen width of 512 points or pixels and a sweep time $T_{swp}$ of 100 milliseconds. A point illumination duration $T_R$ between 16.6 and 40 milliseconds gives a preferred range of $N_R$ of approximately 85 to 205 points. The shortest duration, 85 pixels, corresponds to one sixth of the full screen width.

Figure 6:
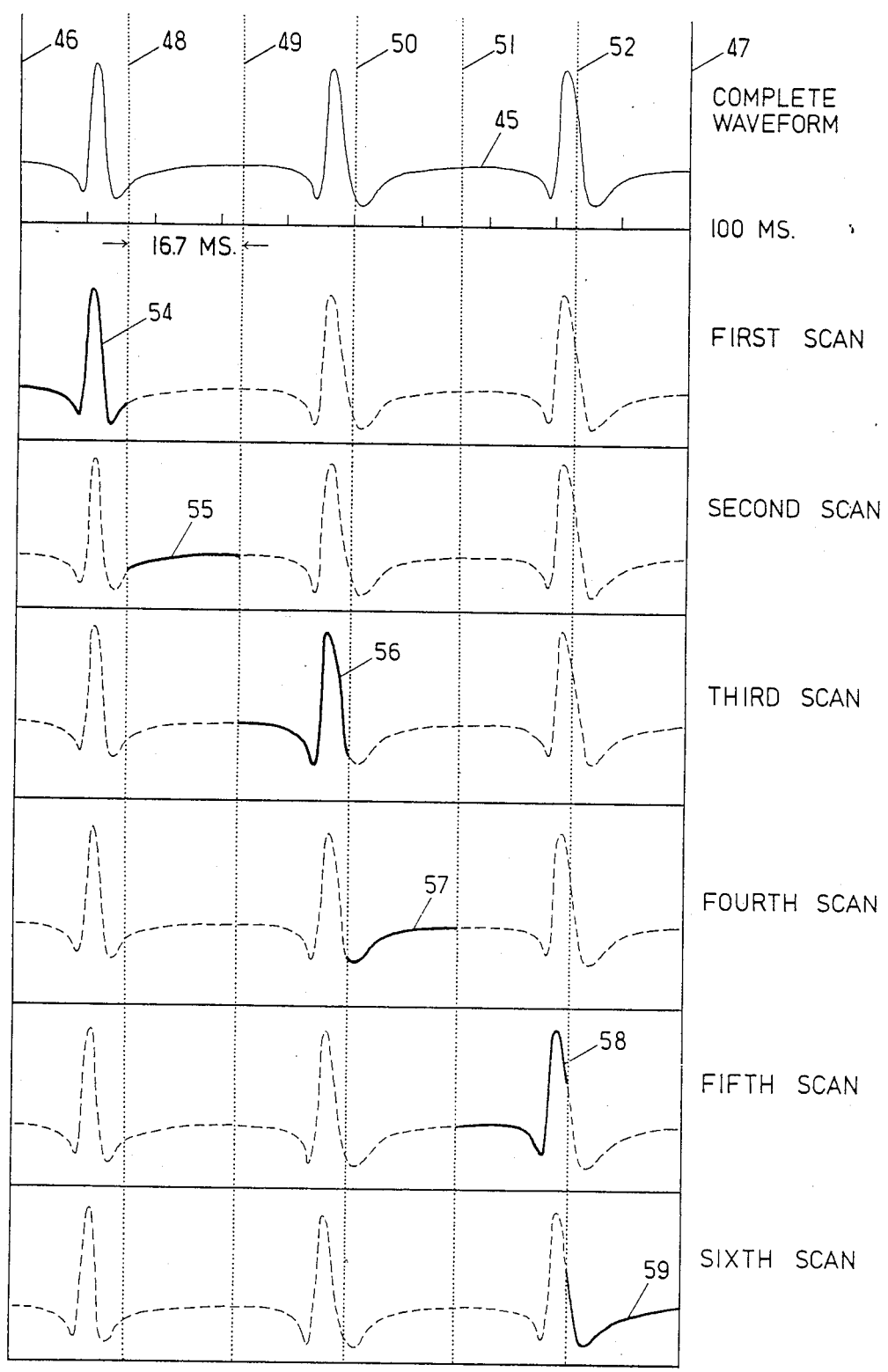
FIG. 6 is an illustrative composite graph illustrating the manner in which a waveform would be displayed to an operator on the raster scanned screen in accordance with the present invention.

The manner in which a sequential display of waveform segments provides the impression of a moving waveform to an observer is illustrated in FIG. 6, in which an exemplary complete waveform is shown at 45 over a 100 millisecond period which corresponds to a typical sweep of the video monitor screen from the left edge 46 of the screen to the right edge 47. The lines 48, 49, 50, 51 and 52 are provided for illustrative purposes across the composite view of FIG. 6 to show the division of the screen horizontally into 6 equal segments, each approximately 16.7 milliseconds in width. For a frame refresh rate of 60 frames per second, a new portion of the waveform containing 85 pixel points is shown with each frame. Thus, the first scan or frame shows the waveform segment 54, the second scan shows the waveform segment 55, the third scan the waveform segment 56, the fourth scan the waveform segment 57, the fifth scan the waveform segment 58, and the sixth scan the waveform segment 59. If the waveform 45 is periodic with a substantially constant period which is integrally related to the sweep time (e.g. 100 milliseconds) across the screen, the waveform will appear substantially fixed in position on the screen and will appear to be rapidly and repetitively scanned from left to right across the screen in a manner similar to the sweep on a conventional oscilloscope. Of particular significance is that intermittent events, such as those encountered in EMG monitoring, will appear on the screen in substantial synchrony with the actual occurrence of the event and its audible record as produced by the loudspeaker. For example, the waveform being observed by the operator during insertion of an EMG needle may be substantially flat except for an intermittent peak which may occur at widely spaced intervals, for example, several seconds apart. The operator will see the flat signal until the time of occurrence of the peak in the signal, at which the peak will immediately appear on the screen and shortly thereafter—e.g., 16.7 milliseconds later—will disappear, in a manner very similar to the manner in which an intermittent peak would appear on an analog oscilloscope. This allows the operator to easily correlate the time of the occurrence of the peak with the audible signal.

To obtain the waveform progression illustrated in FIG. 6, the control computer 18 controls the writing of data from the digitizer 16 into the pixel memory 20 so that only 85 horizontally adjacent data points are stored in the cells of the memory at any point in time. All other data points are erased, i.e., written with a base line datum or color datum corresponding to the background color. As each new datum from the digitizer 16 is provided on the line 17 to the pixel memory, it is written into the waveform memory at a sequentially higher horizontal position cell, and the data in the cell 85 points horizontally lower is erased. Every 16.7 milliseconds— that is, a time period equal to the time it takes to write 85 new data points from the waveform digitizer into the pixel memory—the entire content at that point in time of the cells of the pixel memory is delivered on the output lines 22 to the raster scan graphics control 23. The graphics control unit 23 then provides the output control signals on the lines 26 to control the video monitor 25 to display a new frame containing the new segment of waveform.

An illustrative software program for the system computer 18 which controls the writing of data into the waveform memory is set forth below, it being understood that the actual programing of the control computer would be written in a compiled form (e.g., compiled Pascal) or in assembled assembly language code and stored in a ROM memory within the computer controller in a conventional fashion.

```
program new_nonfade;
var
          new_pointer    : integer; (address of new point)
          erased_pointer : integer; (address of point to erase)
          buffer         : array[1..512] of integer;
          point          : integer;
begin
erased_pointer := 512-85;        (start erasing 85 points back)
while true do
for new_pointer := 1 to 512 do
   begin
   wait_for_digitizer_ready;
   point:=buffer[new_pointer];      (get new point from digitizer)
   draw(point, new_pointer);        (draw a point @ new screen
   point:=buffer[erased_pointer];    position)
   erase(point, erased_pointer);    (erase a point 85 points back
                                     from a new point)
   erased_pointer:=(erased_pointer + 1) mod 512 (advance the
 pointer)
   end;
end.
```

It may be noted that the width of the screen may be divided into segments of arbitrary length as desired, but each segment is preferably of a width such that the dwell of a particular segment on the screen be less than the average human visual latency period, 40 milliseconds, to maximize the impression to the observer of a continuously moving waveform.

It is understood that the invention is not confined to the particular embodiments set forth herein as illustrative, but embraces all such modified forms thereof that come within the scope of the following claims.

What is claimed is:

1. Apparatus for providing a raster scanned display of a time varying signal that emulates an analog display of the signal, comprising:
   (a) a video monitor means, responsive to control signals for providing a raster scanned display on a video screen;
   (b) waveform digitizer means for receiving a time varying input signal and providing digital output data representative of the magnitude of input signal;
   (c) means for receiving the digital data from the waveform digitizer means and providing control signals to the video monitor means to control the video monitor means to scan the screen of the video monitor in a raster to sequentially display illuminated segments of the output waveform which are illuminated consecutively segment by segment across the and such that only the segment being displayed is illuminated, and the displayed segment represents digital data which is more recent than the digital data represented by an earlier displayed segment in the sequence.

2. The apparatus of claim 1 wherein the means for receiving the digital data and providing control signals to the video monitor means includes:
   (1) pixel memory means for receiving one digital data from the waveform digitizer means and storing the data in memory locations for selective readout thereof;
   (2) raster scan graphics control means for receiving digital data read out from the pixel memory which means is representative of sequential magnitude data of the waveform and providing control signals to the video monitor to cause the video monitor to scan its screen in a raster illuminating those points on the screen corresponding to the digital waveform horizontal and vertical position data received from the pixel memory means, and
   (3) control means for controlling the writing of data from the waveform digitizer means into the pixel memory means and the reading of the data from the pixel memory means into the graphic controller means.

3. Apparatus for providing a raster scanned display of time varying signal that emulates an analog display of the signal, comprising:
   (a) video monitor means, responsive to control signals for providing a raster scanned display on a video screen;
   (b) waveform digitizer means for receiving a time varying input signal and providing digital output data representative of the magnitude of input signal;
   (c) means for receiving the digital data from the waveform digitizer means and providing control signals to the video monitor means to control the video monitor means to scan the screen of the video monitor in a raster to sequentially display illuminated segments of the input waveform which are illuminated consecutively across the screen and such that only the segment being displayed is illuminated;
   wherein the means for receiving the digital data and providing control signals to the video monitor means includes:
   (1) pixel memory means for receiving the digital data from the waveform digitizer means and sorting the data in memory locations for selective readout thereof;
   (2) raster scan graphics control means for receiving digital data read out from the pixel memory means which is representative of sequential magnitude data of the waveform and providing control signals to the video monitor to cause the video monitor to scan its screen in a raster illuminating those points on the screen corresponding to the digital waveform horizontal and vertical position data received from the pixel memory means, and
   (3) control means for controlling the writing of data from the waveform digitizer means into the pixel memory means and the reading of the data from the pixel memory means into the graphic controller means; and
   wherein the pixel memory means has a plurality of memory location cells, and wherein the control means controls the writing of the data from the digitizer means such that each new digital data point from the digitizer means is written into the waveform memory cells of the pixel memory means at a horizontally sequentially higher memory location address with wrap-around after exceeding the highest address in the memory back to the initial memory address in a circular fashion, while also erasing to a baseline datum the memory location a selected number of memory locations horizontally behind the memory location of the new data point, such that the memory cells at any point in time only contain data in a selected number of cells corresponding to the selected length of the waveform segment to be displayed on the video screen, with all other cells in the memory written to a base line datum.

4. The apparatus of claim 1, wherein the segment of the waveform displayed on the video screen of the video monitor means is changed with each new frame of the raster scan display on the video screen.

5. Apparatus for providing a raster scanned display of a time varying signal that emulates an analog display of the signal, comprising:
   (a) video monitor means, responsive to control signals for providing a raster scanned display on a video screen;
   (b) waveform digitizer means for receiving a time varying input signal and providing digital output data representative of the magnitude of input signal;
   (c) means for receiving the digital data from the waveform digitizer means and providing signals to the video monitor means to control the video monitor means to scan the screen of the video monitor means in a raster to sequentially display illuminated segments of the input waveform which are illuminated consecutively across the screen and such that only the segment being displayed is illuminated;

wherein the pixel memory means has a plurality of memory location cells, and wherein the control means controls the writing data from the digitizer means such that each new digital data point from the digitizer means is written into the waveform memory cells of the pixel memory means at a horizontally sequentially higher memory location address with wrap-around after exceeding the highest address in the memory back to the initial memory address in a circular fashion, while also erasing to a baseline datum the memory location a selected number of memory locations horizontally behind the memory location of the new data point, such that the memory cells at any point in time only contain data in a selected number of cells corresponding to the selected length of the waveform segment to be displayed on the video screen, with all other cells in the memory written to a base line datum; and wherein data is read from the pixel memory means to the raster scan graphics control means at selected times separated by the period of time required to write an entirely new set of data points constituting a new waveform segment in the pixel memory means while correspondingly erasing each of the previous waveform segment data points in the pixel memory means.

6. The apparatus of claim 5 wherein the number of pixels $N_R$ in the segment of the waveform which is illuminated at any point in time on the screen of the video monitor means is determined by the expression $N_R = N(T_R/T_{SWP})$, where N is the number of pixels in the horizontal screen width, $T_R$ is a selected duration of illumination of each segment of the waveform data on the screen, and $T_{SWP}$ is the time in which the waveform will be swept across the horizontal width of the screen.

7. The apparatus of claim 6 wherein the duration time $T_R$ of the pixels in any particular segment of the waveform displayed on the screen is between approximately 16.6 milliseconds and 40 milliseconds.

8. The apparatus of claim 1 including an audio amplifier connected to receive the time varying input signal which is provided to the waveform digitizer means and a speaker which receives the amplified output signal from the audio amplifier.

9. The apparatus of claim 5 wherein the pixel memory means is a random access memory having a plurality of addressable memory locations equal to the number of pixels in the horizontal width of the screen of the video monitor means.

10. Apparatus for providing a raster scanned display of a time varying signal that emulates an analog display of the signal, comprising:
 (a) video monitor means responsive to control signals for providing a raster scan display on a video screen;
 (b) waveform digitizer means for receiving the time varying input signal and providing digital output data representative of the magnitude of the input signal;
 (c) pixel memory means containing a plurality of addressable memory locations for receiving data which can be selectively written into and read out of the memory locations;
 (d) raster scan graphics control means for receiving the digital data from the memory locations of the pixel memory means and providing control signals to the video monitor means such that it scans its screen in a raster illuminating those points on the screen corresponding to the digital waveform horizontal and vertical position data received from the pixel memory means;
 (e) control means for controlling the writing of data from the digitizer means into the pixel memory means and the reading of the data from the memory means into the raster scan graphics control means, wherein the data from the digitizer means is written into the pixel memory means in horizontally sequential locations such that as each sequentially higher location is written with a new datum from the waveform digitizer means, the memory location a selected number of data locations in the memory means behind the new data point, corresponding to the desired length of a segment of the data to be displayed on the screen, is erased to a baseline datum, and wherein the control means controls the writing of the contents of the memory locations of the pixel memory means to the raster scan control means at selected times such that an entirely new segment of waveform data is in the waveform memory and all previous data segments which had been read out previously to the graphic scan control means are erased to a baseline datum.

11. The apparatus of claim 10 wherein the pixel memory means has a plurality of memory location cells, and wherein the control means controls the writing of data from the digitizer means such that each new digital data point from the digitizer means is written into the memory cells of the pixel memory means at a horizontally sequentially higher memory location address with wrap-around after exceeding the highest address in the memory back to the initial memory address in a circular fashion, while also erasing to a baseline datum the memory location a selected number of memory locations behind the memory location of the new data point, such that the memory cells at any point in time only contain data in a selected number of cells corresponding to the selected length of the waveform segment to be displayed on the video screen, with all other cells in the memory written to a base line datum.

12. The apparatus of claim 10 wherein the segment of the waveform displayed on the video screen of the video monitor means is changed with each new frame of the raster scan display on the video screen.

13. The apparatus of claim 11 wherein data is read from the pixel memory means to the raster scan graphics control means at selected times separated by the period of time required to write an entirely new set of data points constituting a new waveform segment in the pixel memory means while correspondingly erasing each of the previous waveform segment data points in the waveform memory.

14. The apparatus of claim 13 wherein the number of pixels $N_R$ in the segment of the waveform which is illuminated at any point in time on the screen of the video monitor means is determined by the expression $N_R = N(T_R/T_{SWP})$, where N is the number of pixels in the horizontal screen width, $T_R$ is a selected duration of illumination of each segment of the waveform data on the screen, and $T_{SWP}$ is the time in which the waveform will be swept across the horizontal width of the screen.

15. The apparatus of claim 14 wherein the duration time $T_R$ of the pixels in any particular segment of the waveform displayed on the screen is between approximately 16.6 milliseconds and 40 milliseconds.

16. The apparatus of claim 10 including an audio amplifier connected to receive the time varying input signal which is provided to the waveform digitizer means and a speaker which receives the amplified output signal from the audio amplifier.

17. The apparatus of claim 13 wherein the pixel memory means is a random access memory having a plurality of addressable memory locations equal to the number of pixels in the horizontal width of the screen of the video monitor means.

18. A method of providing a raster scan display of a time varying signal to emulate an analog display of the signal, comprising the steps of:
(a) sampling the time varying signal and providing digital data indicating the magnitude of the signal at the sample times;
(b) storing the data indicative of the magnitude of the signal for a selected number of samples corresponding to the desired length of a segment of a waveform to be displayed which is less than the entire length of time of a waveform which could be displayed in a single sweep across the face of a raster scanned video monitor screen;
(c) illuminating points in a frame of a raster scan display on a video screen which correspond to the segment of stored digital data which is less than the entire width of a screen of the video monitor;
(d) then storing new digital data corresponding to the selected number of data points in a new segment; and
(e) then illuminating the new segment of waveform data points on the screen of the video monitor during a new frame of the raster scan of the video screen and not illuminating any other points corresponding to previous segments of the waveform which had been illuminated in previous frames.

19. The method of claim 18 wherein a new segment of waveform data is displayed on the screen of a video monitor for each new raster scan frame on the video monitor screen.

* * * * *